US007986197B2

(12) United States Patent
Akcasu et al.

(10) Patent No.: US 7,986,197 B2
(45) Date of Patent: Jul. 26, 2011

(54) COMPACT DISTRIBUTED LADDER ATTENUATOR

(75) Inventors: Osman Ersed Akcasu, Morgan Hill, CA (US); Barbaros Sekerkiran, Istanbul (TR)

(73) Assignee: Lonestar Inventions, L.P., Austin, TX (US)

( * ) Notice: Subject to any disclaimer, the term of this patent is extended or adjusted under 35 U.S.C. 154(b) by 304 days.

(21) Appl. No.: 12/209,988

(22) Filed: Sep. 12, 2008

(65) Prior Publication Data

US 2010/0066480 A1 Mar. 18, 2010

(51) Int. Cl.
*H03H 7/24* (2006.01)
(52) U.S. Cl. .................. 333/81 R; 257/536; 323/354
(58) Field of Classification Search .............. 257/536, 257/904; 323/354, 369, 353; 338/89; 341/154; 333/81 R
See application file for complete search history.

(56) References Cited

U.S. PATENT DOCUMENTS

| | | | |
|---|---|---|---|
| 4,381,499 A | 4/1983 | Struthoff | |
| 4,468,607 A | 8/1984 | Yamada et al. | |
| 5,039,961 A * | 8/1991 | Veteran | 333/81 A |
| 5,637,908 A * | 6/1997 | Lowther et al. | 257/489 |
| 5,969,658 A | 10/1999 | Naylor | |
| 7,323,933 B2 * | 1/2008 | Gilbert | 330/254 |
| 2004/0169256 A1 * | 9/2004 | Kellner-Werdehausen et al. | 257/536 |
| 2007/0200199 A1 * | 8/2007 | Murakami et al. | 257/536 |
| 2008/0204299 A1 * | 8/2008 | Christ | 341/158 |

* cited by examiner

*Primary Examiner* — Adolf Berhane
*Assistant Examiner* — Fred E Finch, III
(74) *Attorney, Agent, or Firm* — Kilpatrick Townsend & Stockton LLP; Kenneth R. Allen

(57) ABSTRACT

Simple and compact structures for an attenuator or resistor ladder can be implemented in a standard integrated circuit process as well as hybrid, thick or thin film ceramic processes, which allows metallization along with resistive components. The structure has the mathematical property that it attenuates an applied reference voltage logarithmically/exponentially along its length because of the natural solution of the Laplace equation for this type of geometry and contact configuration.

10 Claims, 13 Drawing Sheets

$$\frac{V_{out}}{V_{in}} = \frac{1}{k+1}$$

COMPACT DISTRIBUTED LADDER ATTENUATOR

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

This invention relates to analog and digital circuits formed in semiconductor, thick film or thin film ceramic materials. More particularly, this invention relates to resistor arrays in such materials.

Compact logarithmic attenuators and reference ladders are important for various applications in electronic circuits like digital-to-analog converters, analog-to-digital converters, analog circuits and many radio frequency circuits. Resistor ladder networks are well known; for example, see "Monolithic Integrable R-2R Network," Holger Struthoff, U.S. Pat. No. 4,381,499, April, 1983; "R/2R Ladder Circuit and Method for Digital-to-Analog Converter," Jimmy R. Naylor, U.S. Pat. No. 5,969,658, October 1999; and "Ladder Type Signal Attenuator," Kounji Tanaka and Susumu Yamada, U.S. Pat. No. 4,468,607, August 1984.

BRIEF SUMMARY OF THE INVENTION

According to the invention, simple and compact structures formed of resistors and the like are provided that can be implemented in a standard integrated circuit, hybrid, thick or thin film ceramic process, which allows metallization along with resistive components. One structure has the mathematical property that it attenuates an applied reference voltage logarithmically/exponentially along its length because of the natural solution of Laplace's equation for this type of geometry and contact configuration. Another attenuator structure is an extension of a linear attenuator in the radial direction resulting in a radial attenuator. This has attenuation properties in radial direction that can be used in various applications.

The invention will be better understood upon reference to the following detailed description with accompanying drawings.

DETAILED DESCRIPTION OF THE INVENTION

Figure 1A:
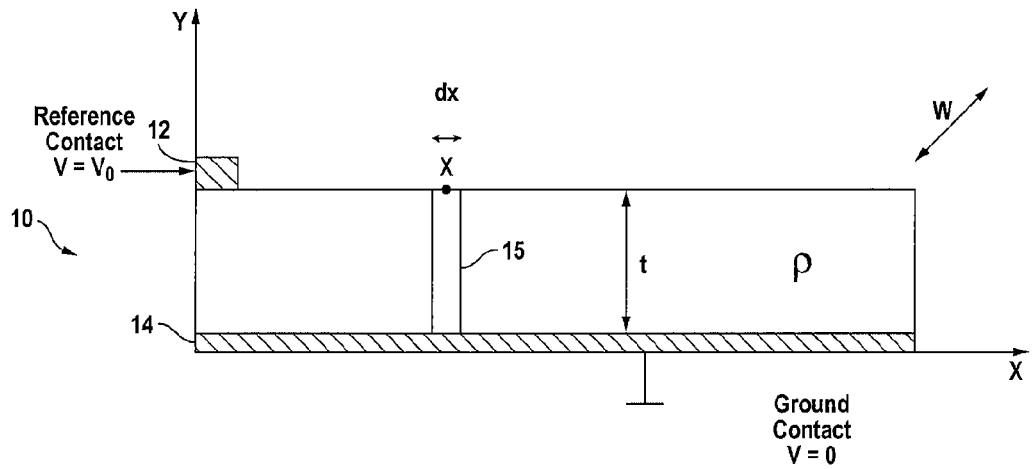
FIG. 1A is a side cross sectional view of a structure that generates a specific attenuation characteristic along its length.

FIG. 1A shows a structure 10 that will generate logarithmic/exponential attenuation along the x length of a reference voltage $V_o$ applied at the reference contact 12. As can be seen the bottom contact 14 is grounded. The structure 10 has a substrate of semiconductive resistive material 13 has thickness of t and resistivity of ρ and a width of w. More specifically, the structure 10 is in a bulk electrical semi-conductive material where the bottom contact is a planar ground plane and the substrate 13 is formed of a planar distributed resistive material of a conventional semiconductor, hybrid, thick film or thin film resist disposed upon the ground plane. The reference electrical contact 12 is at one margin on top of the substrate 13, and a plurality of attenuation/division electrical contacts 21, 22, 23, 24, 25, etc. (FIG. 2) are disposed along the top of the substrate 13, such that between each attenuation/division contact 21-25 and the reference electrical contact 12 there are plurality of first two dimensional resistors R in a longitudinal pattern, and between each the attenuation/division electrical contacts 21-25 and the ground plane a plurality of second two dimensional resistors 2R are in a vertical pattern so that they together form a distributed ladder resistor network having the mathematical property that the structure attenuates an applied reference voltage logarithmically/exponentially along its length. Another attenuator structure is an extension of a linear attenuator in the radial direction resulting in a radial attenuator. This has attenuation properties in radial direction that can be used in various applications. The current entering the structure 10 from the reference contact will distribute it self non-uniformly on the bottom ground contact. A numerical two-dimensional solution of Laplace's equation in this region is very straightforward. There are many commercially available software simulation programs which can calculate the potential and current density distribution for any boundary conditions possible for the structure. With the numerical methods, the solution for the desired condition can be obtained. But the results can not be very easily related to the parameters of the equation solved. On the other hand if the solution can be obtained analytically, even afterward by some reasonable approximations, the solution and its functional dependency on the input parameters are very clearly seen. An analytical solution with the right assumption yields a good way of showing the "logarithmic/exponential division" property of this simple structure.

Figure 1B:
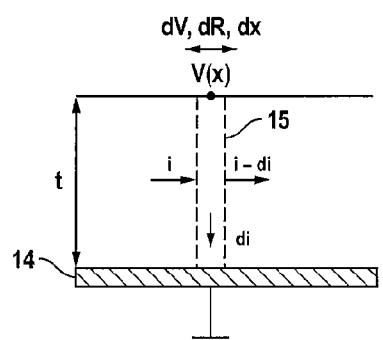
FIG. 1B is a diagram illustrating parameters that allow calculation of the attenuation characteristic.

Assume that the thickness t is very small compared the length of the structure 10 and that it has uniform voltage along the y axis. This first assumption will bring the formulation into a one dimensional formulation, which is simpler to handle analytically. Thus one can assume voltage distribution is only a function of x spatial variable represented as V(x) in FIG. 1B for the dx stripe at x, there will be a voltage drop of dV in the x axis and no voltage drop in the y axis due to the current i passing through it and its x directional differential resistance dR associated with it. As a second assumption, the bottom 14 of the stripe with the width dx is always kept at the ground potential of 0 volts. This will introduce a y directional current di, going to the ground electrode related to the voltage value V(x) and its y directional resistance. Due to conservation of current in the resistive stripe, the current coming out from the right surface 15 along the x axis of the stripe will be i-di, where i is the current coming from the left of the stripe along x axes. This current loss to the ground contact along the x axis of the stripe is the reason for attenuation of the structure along x axes. Since the second assumption is the maintaining of a constant voltage of 0 volts at the ground contact, ideally it has to have infinite conductivity. However practically, it merely has to have a much lower resistivity than the resistivity of the resistive layer ρ used in the attenuator. The complete mathematical formulation of the attenuation process under these assumptions is as follows:

Resistance of a rectangular structure is given as $$R = \rho \frac{l}{w \cdot t} \tag{1}$$

where l, ρ, w and t are length along the current flow direction, resistivity in ohm-cm, width and thickness respectively. Therefore the x directional differential resistivity dR of the dx stripe is given as $$dR = \rho \frac{dx}{w \cdot t} \tag{2}$$

Since the current passing through this dx stripe is i, the voltage drop along the x axis can be given as, $$dV = i \cdot dR \tag{3}$$

Substituting (2) in (3), $$dV = i \cdot \rho \frac{dx}{w \cdot t} \tag{4}$$

Rearranging the derivative terms gives, $$\frac{dV}{dx} = i \frac{\rho}{w \cdot t} \tag{5}$$

On the other hand, the current di, is the current that flows along the y axis and is collected by the ground terminal at the bottom. It is simply a function of the stripe voltage V and its y directional resistivity given as $$di = \frac{V}{R} = \frac{V}{\rho \cdot \frac{t}{w \cdot dx}} \tag{6}$$

Re-arranging (6) gives $$di = \frac{V \cdot w \cdot dx}{\rho \cdot t} \tag{7}$$

Grouping the differential operators as done in (5) gives $$\frac{di}{dx} = \frac{V \cdot w}{\rho \cdot t} \tag{8}$$

Equations (5) and (8) are the basic differential equations to explain the invention, which gives the voltage and current relation along the x axis. A simple examination shows that they are also related. By a simple substitution and another differentiation with respect to x, the number of differential equations that characterizes the attenuation can be reduced to a single differential equation. Differentiating (5) with respect to x, $$\frac{d^2 V}{dx^2} = \frac{d}{dx}\left(i \frac{\rho}{w \cdot t}\right) \tag{9}$$

In (9), i is the only variable which is a function of x in brackets. Therefore by applying a derivative operator to i gives $$\frac{d^2 V}{dx^2} = \frac{di}{dx} \frac{\rho}{w \cdot t} \tag{10}$$

Substituting (8) in (10) yields the differential equation $$\frac{d^2 V}{dx^2} = \frac{\rho}{w \cdot t} \cdot \frac{V \cdot w}{\rho \cdot t} \tag{11}$$

Which simplifies as, $$\frac{d^2V}{dx^2} = \frac{V}{t^2} \tag{12}$$

Equation (12) can be re-written in its general familiar form as, $$\frac{d^2V}{dx^2} - \frac{1}{t^2}V = 0 \tag{13}$$

This is the differential equation that formulates the voltage attenuation along the x axis. It is a second order ordinary differential equation with constant coefficients and the analytical solution is available as given in any elementary calculus or differential equation reference. Let $\alpha$ be, $$\alpha = \frac{1}{t} \tag{14}$$

The analytical solution is the well-known relation given as, $$V(x) = A \cdot e^{-\alpha \cdot x} + B \cdot e^{\alpha \cdot x} \tag{15}$$

Since the potential at when x approaching to $\infty$, has to be a finite value. This can be represented as, $$x \to \infty, V(\infty) < \infty \text{ so } B = 0 \tag{16}$$

To solve the arbitrary integration constant A, we use the reference contact voltage as a boundary condition at x=0 as $V(0)=V_o$. This gives $A=V_0$. Therefore the complete solution becomes, $$V(x) = V_0 e^{-\frac{x}{t}} \tag{17}$$

Instead of differentiating (5) one could have differentiated (8) with respect to x and substitute (5) in it, $$i(x) = i_o e^{-\frac{x}{t}} \tag{18}$$

Figure 2:
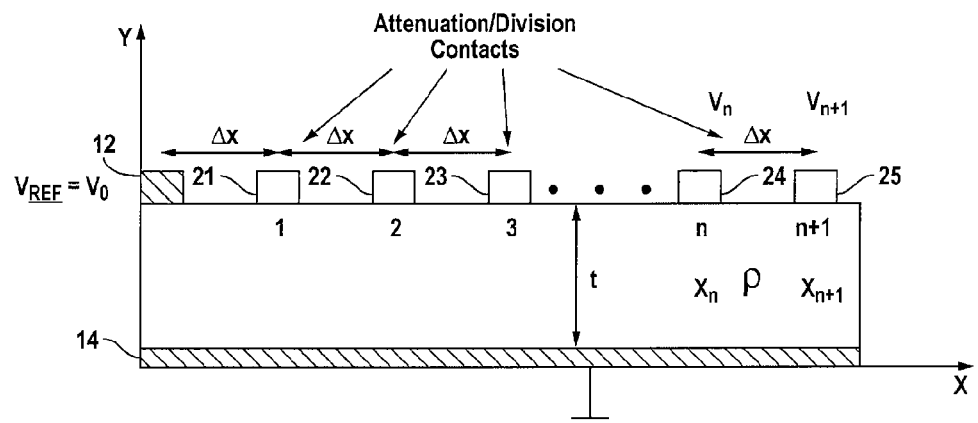
FIG. 2 is a side cross sectional view of a structure with contacts according to the invention.

The beauty of the solution given at (17) and (18) is its simplicity and independence of any other variable than t. Voltage or current attenuates itself along the x axis exponentially. In other words for every t distance traveled along x axis, the voltage becomes attenuated by e, as a result of the geometry. So one can select a reasonably small thickness. By placing contacts 21-25 consistently separated by t, one can achieve precise exponential voltage or current attenuation of the reference voltage or current for a small length and width in an integrated circuit, hybrid or multi-layered ceramic, which has resistive elements, as shown in FIG. 2.

Voltage Attenuation Along x Axis

If the desired attenuation between contacts is other than e between contacts, such as 1/10, the desired attenuation can be achieved simply by calculating simple multiples of t as follows. Let $V_n$ and $V_{n+1}$ are the voltages between adjacent attenuation or division contacts, as shown in FIG. 2, $$V_n = V_0 e^{-\frac{x_n}{t}} \tag{19}$$

$$V_{n+1} = V_0 e^{-\frac{x_{n+1}}{t}} \tag{20}$$

Let $A_t$ represent the attenuation value desired between contacts, $$\frac{V_{n+1}}{V_n} = A_t \tag{21}$$

$$A_t = e^{\frac{x_n - x_{n+1}}{t}} \tag{22}$$

$$\ln A_t = \frac{x_n - x_{n+1}}{t} \tag{23}$$

The required spacing between adjacent attenuation or division contacts should be $$\Delta x_{contact} = -t \cdot \ln A_t = t \cdot \ln\frac{1}{A_t} \tag{24}$$

It is clear that since $A_t<1$, equation (24) is always positive and physically realizable as long as t is within processing capabilities.

Figure 3A:
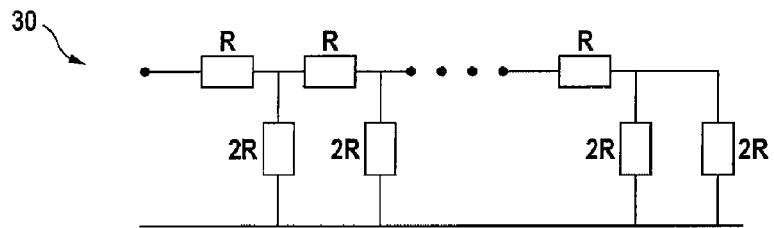
FIG. 3 is a schematic of a conventional (prior art) R-2R to R-2R-2R ladder.

In a digital to analog converter application according to the invention, the most desirable attenuation ratio is 1/2, and it is generally achieved by a R/2R ladder network 30, as shown in FIG. 3, a standard schematic for such a ladder. One of the most challenging issues of constructing such a structure is to maintain the ratio of the ladder resistors at exactly 1/2 over process and temperature variations and most challengingly over temperature gradients that exists on the chip. To minimize the unwanted effects due to the process variations the R/2R ladder network becomes realizable in a fairly large area, compared to the overall circuit. Having anything realized in a large area becomes more sensitive to the undesirable thermal gradient effects and process variations. In some cases even trimming is required.

Applying (24), to have an attenuation ratio of 1/2 between the adjacent attenuation contacts, the spacing between them will result in 0.693147.t. For attenuation ratio of 1/10, the spacing between adjacent attenuation or division contacts should be 2.302585.t. These ratios allow a very compact attenuator divider network to be realized in integrated circuit, hybrid and multi-layer ceramic applications.

As an example, using a 1 micron contact size integrated circuit technology, a 14-bit ladder structure can be realized in the order of 3 by 30 micron silicon real estate, not even thinkable with the R/2R ladder layout for the same technology. The realization of a very small area attenuator or divider network improves its performance over temperature, temperature gradient and process variability.

Figure 3B:
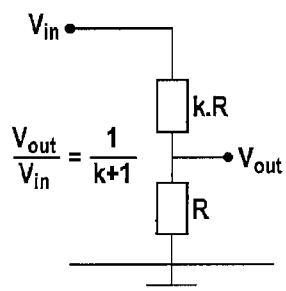

A further application of the linear attenuator is in the simplest divider structure shown in FIG. 3B. If the divider resistor ratio k becomes large, the divider geometry will occupy a very large area in the integrated circuit, since the controllable smallest resistor structure geometry cannot be made smaller than a certain area. Having k very large makes the structure very large as well. But the linear attenuator according to the invention can achieve a very large attenuation in a small area measured in several microns, which can easily replace the large value voltage dividers in integrated circuit applications in a much smaller area.

Current Attenuation Along x Axis

A similar analysis can be done for current attenuation along x axis as given above. Consider the distribution of the collected current at the bottom ground contact along the x axis. Needless to say the collected current at the ground contact is injected by the reference contact. Since there is no other contact, they should be equal to each other due to current conservation.

Figure 4:
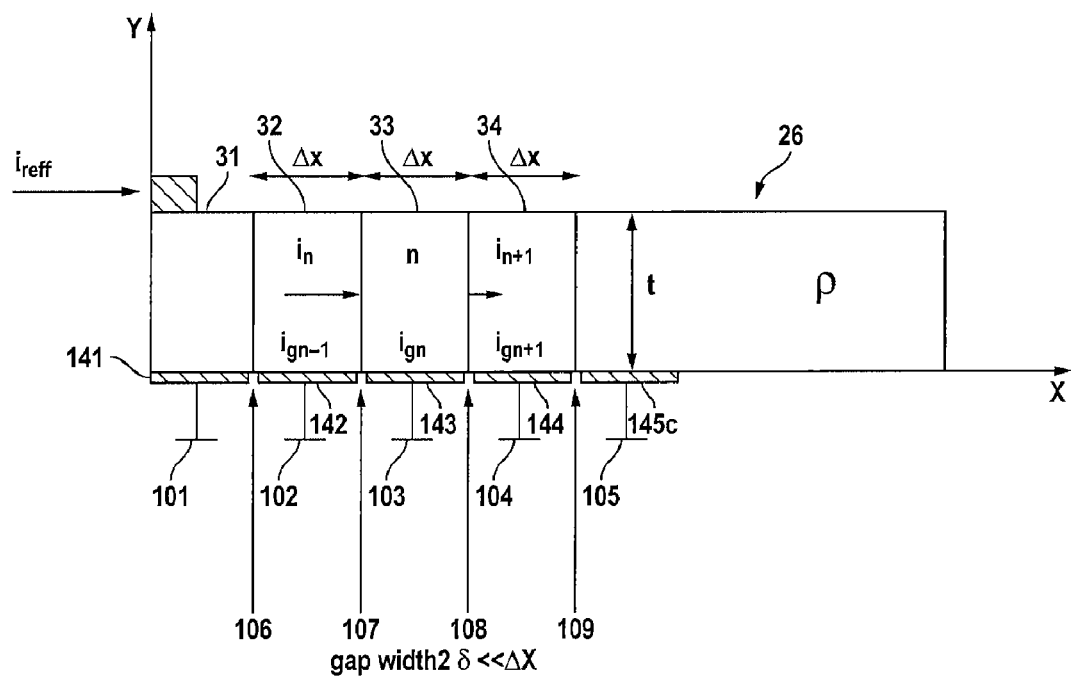
FIG. 4 is a diagram illustrating computation parameters for an R-2R ladder.

As shown in FIG. 4, the attenuator region is divided to k equal sections 31-34, each having widths of $\Delta x$. Using the current equation given at (18), the current coming into the section n 33 and coming out of it can be given as $$i_n = i_0 \cdot e^{-\frac{x_n}{t}} \quad (25)$$

$$i_{n+1} = i_0 \cdot e^{-\frac{x_{n+1}}{t}} \text{ where } x_{n+1} = x_n + \Delta x \quad (26)$$

The difference between (25) and (26) is the current collected by the ground contact 103 of that section $i_{gn}$, as the result of the current conservation law shown below as, $$i_{gn} = i_n - i_{n+1} \quad (27)$$

Substituting (25) and (26) in (27) yields, $$i_{gn} = i_0 \cdot e^{-\frac{x_n}{t}} - i_o \cdot e^{-\frac{x_n + \Delta x}{t}} \quad (28)$$

Re-arranging (28) yields $$i_{gn} = i_0 \cdot e^{-\frac{x_n}{t}} \left(1 - e^{-\frac{\Delta x}{t}}\right) \quad (29)$$

For the n+1$^{th}$ section one obtains $$i_{gn+1} = i_0 \cdot e^{-\frac{x_{n+1}}{t}} \left(1 - e^{-\frac{\Delta x}{t}}\right) \quad (30)$$

By taking the ratios of (29) and (30) one obtains $$\frac{i_{gn}}{i_{gn+1}} = \frac{e^{-\frac{x_n}{t}}}{e^{-\frac{x_{n+1}}{t}}} = \frac{e^{-\frac{x_n}{t}}}{e^{-\frac{x_n + \Delta x}{t}}} = e^{\frac{\Delta x}{t}} \quad (31)$$

As can be seen in (31) the ground current collection distribution along the x axis is also exponential, and an expression similar to (24) can be written. If $A_{ti}$ is the desired current attenuation given as, $$A_{ti} = \frac{i_{gn}}{i_{gn+1}} \quad (32)$$

Solving (31) yields, $$\Delta x = t \cdot \ln A_{ti} \quad (33)$$

As can be seen, this result is similar to the voltage attenuation expression given by (24). Instead of making the ground contact 101-105 into a continuous conductor, if it is divided to equal sections 141-144 with lengths of $\Delta x$ separated by small gaps $\delta$ 106-109 with respect to $\Delta x$, as shown in FIG. 4, the collected ground currents will be according to equation (33).

Two Dimensional Numerical Solution of the Potential and Current Distribution in the Linear Attenuator Structure The analytical derivation of the linear logarithmic/exponential attenuation property of the geometry was explained earlier. This gives a good understanding of the attenuation process for some valid assumptions. Voltage and current distribution in an arbitrary region with arbitrary contact configuration can be completely modeled by the Laplace equation, which is the sub-set of the Maxwell equations. The results of the numerical simulation based on two-dimensional solution of the Laplace equation should be compared with the analytical solution shown earlier for the completeness of the analysis and design of the attenuator.

Figure 5:
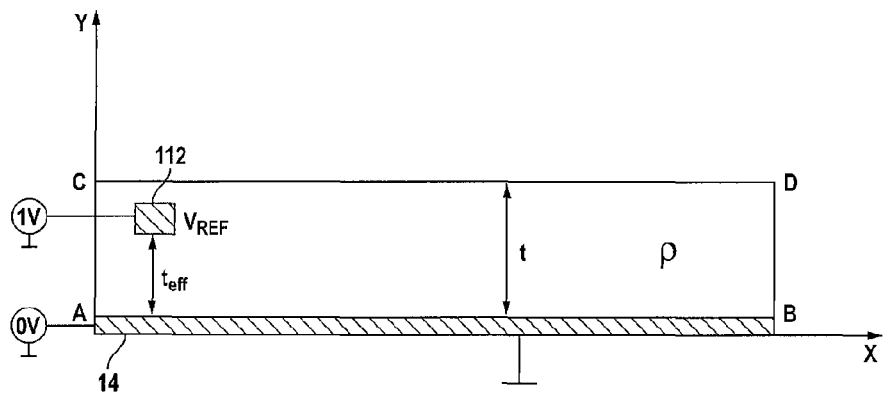
FIG. 5 is a cross sectional view illustrating the relationship between parameters.

The Laplace equation can be written as, $$\nabla(\sigma \nabla V) = 0 \quad (34)$$

where $\sigma$ is the conductivity of the region and is the inverse of the resistivity $\rho$ described in equation (1). As will be explained hereinafter, the planar version of the linear attenuator is more suitable for integrated circuits, as thick and thin film multi-layered ceramic applications. Therefore, for the correctness of the mathematical formulation, the conductivity $\sigma$ in (34) has to be replaced by the inverse of the sheet resistivity of the attenuator resistive layer. The planarized linear attenuator region where (34) is solved is shown in connection with FIG. 5.

The proper boundary conditions for Laplace's equation for the linear attenuator structure are mixed boundary conditions. Since the contact voltages at the reference contact and the bottom ground terminal is known, Dirichlet boundary conditions are applied to the contacts. For convenience, the 1 Volt reference voltage is applied to the reference contact 112 and 0 Volt to the ground terminal 14 along AB in FIG. 5. Since current does not leave or enter any other regions than the contacts, the remaining boundary conditions are Neumann type boundary conditions, which forces the normal derivative of the potential to be zero at the boundaries ACDB. Numerical solution of (34) is obtained by solving it by discrete variable methods such as finite difference or finite element methods easily.

Figure 6:
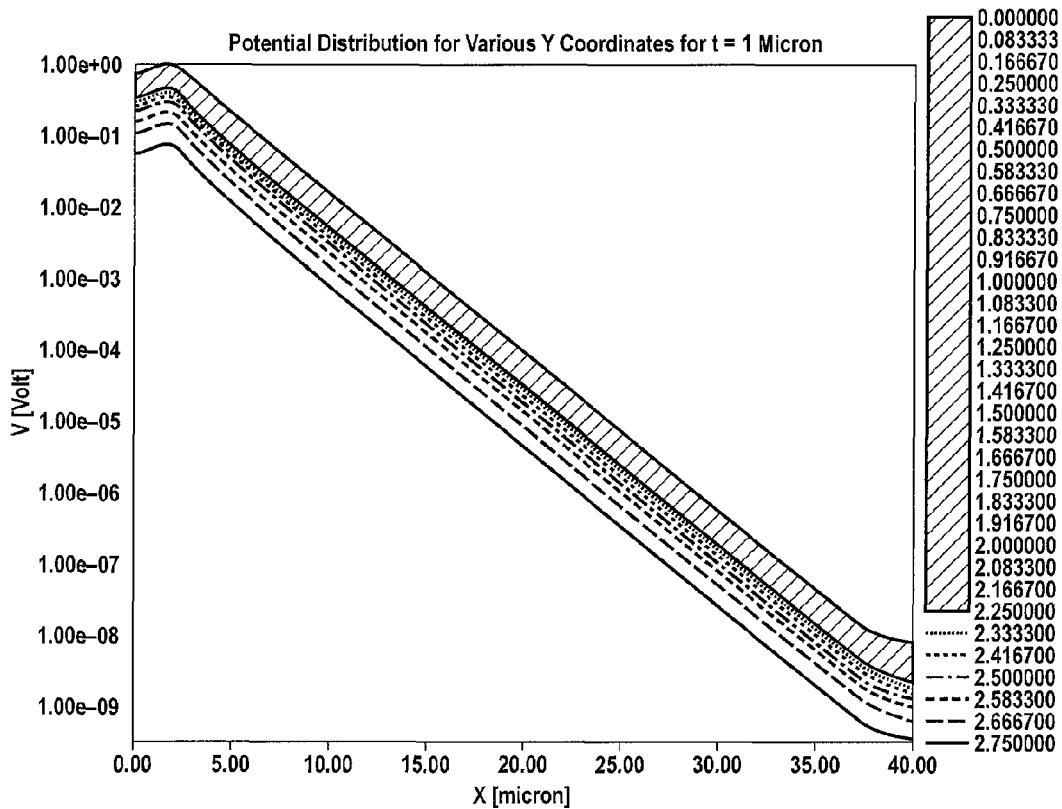
FIG. 6 is a graph of potential distribution for a selection of Y coordinates of FIG. 5 for t=1 micron.
Figure 7:
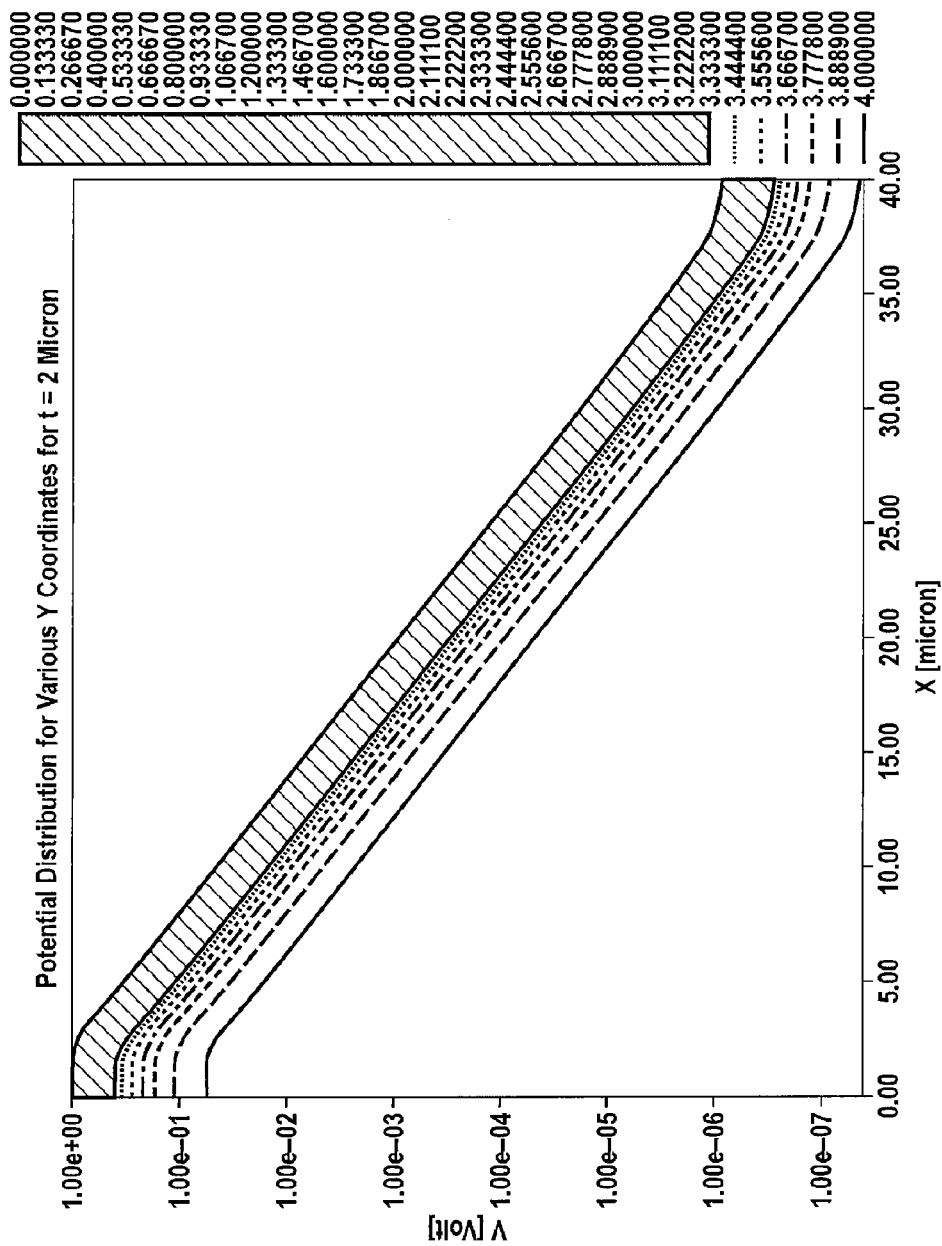
FIG. 7 is a graph of potential distribution for a selection of Y coordinates of FIG. 5 for t=2 microns.
Figure 8:
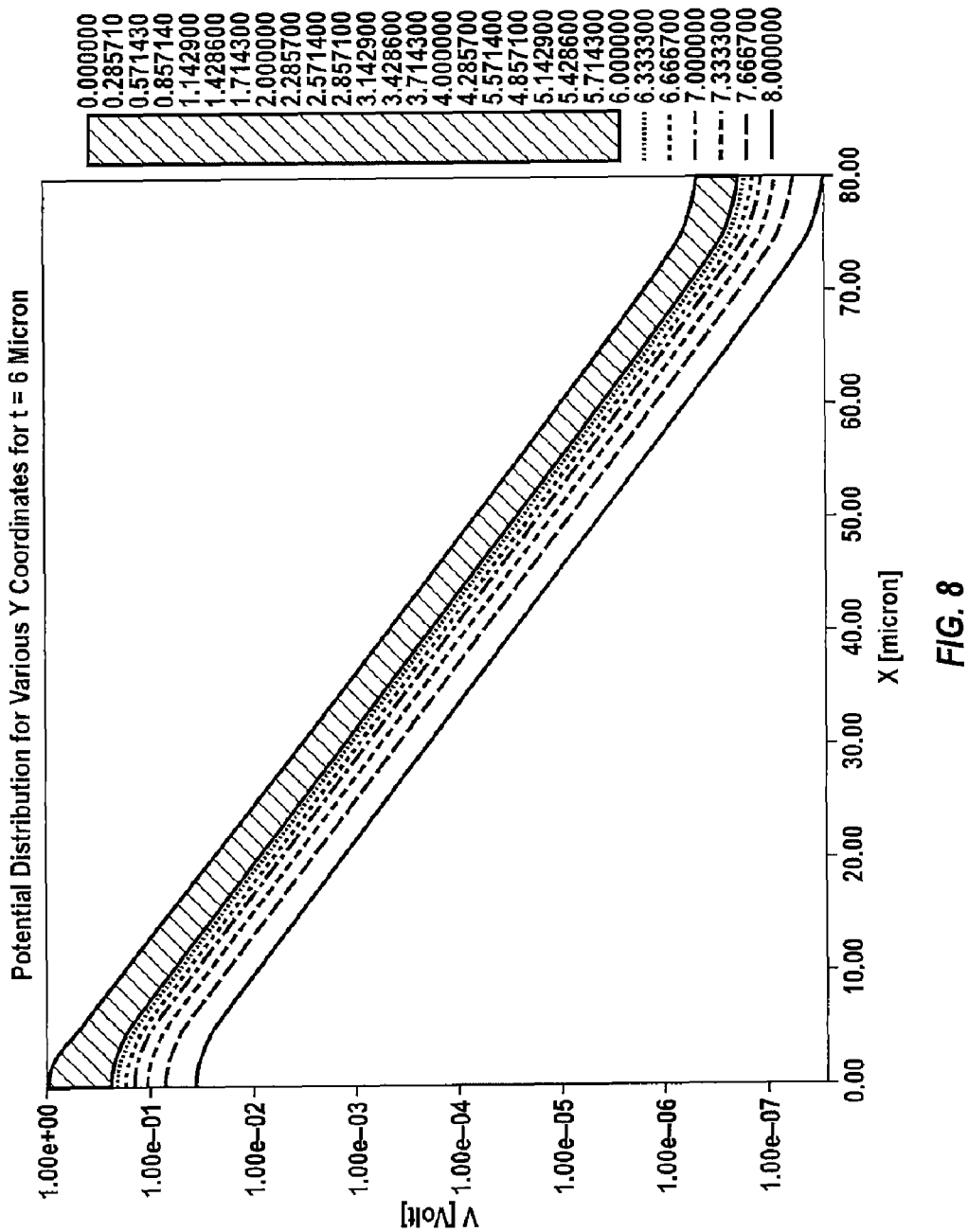
FIG. 8 is a graph of potential distribution for a selection of Y coordinates of FIG. 5 for t=6 microns.
Figure 9:
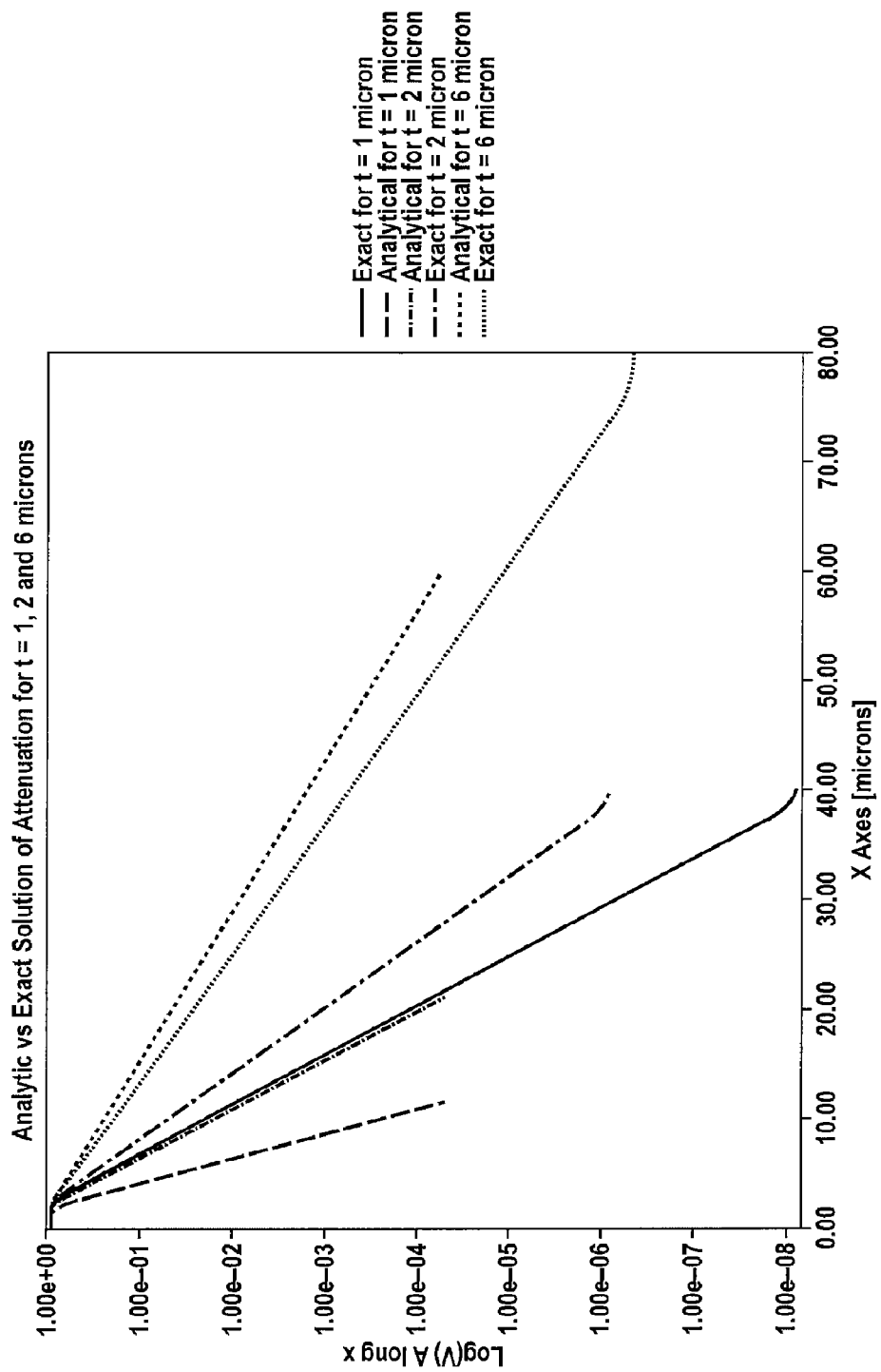
FIG. 9 is a graph comparing analytical and exact solutions for various values of t.

Using the design program "METAL," a Two and Three Dimensional Capacitance and Resistance Simulator, available commercially from OEA International Inc. of Morgan Hill, Calif., with its preparatory "Ladder Designer" capability, the exact geometry has been simulated numerically, and the potential distribution along x axis for several y coordinates are shown in logarithmic scale in FIG. 6 for t=2 and $t_{eff}$=1 micron, where $t_{eff}$ is the vertical distance between the bottom of the reference contact and side ground as shown in FIG. 5 and FIGS. 10A, 10B, 11A and 11B. As can be seen, the voltage distribution along x axis shows an exponential decay as predicted by the analytical derivation done earlier in a fairly large region between the reference contact and the end of the structure. It is normal to expect a deviation from the analytical solution in the proximity of the reference contact and at the end of the structure due to two-dimensional effects. FIG. 7 and FIG. 8 show the potential distribution along x axis for several y coordinates in logarithmic scale as in FIG. 6, but for t=3 and 8 microns for resulting $t_{eff}$=2 and 6 microns respectively. FIG. 9 shows the analytical and numerical solutions for various thickness t of the attenuator at y=t. As can be seen, the slope of the voltage attenuation along x axis is also different compared to the analytical solution given by (17). This is also an expected resulting from the first assumption of assuming no voltage drop along y axes. But the most important conclusion is the voltage attenuation along x axis shows a first order exponential decay property as predicted by the analytical derivation and which is the basis of an aspect of the invention. For determining the exact placements of the division contacts with the desired current or voltage attenuation values one needs to use the solution of the Laplace's equation. This is done by "Ladder Designer" capability of the "METAL" program.

Ladder Designer

The "Ladder Designer" capability of the "METAL" program takes user geometry and physical inputs such as the geometry, resistivity, if any, insulator regions, and contact geometries for the reference and ground contact or contacts. Any arbitrary shape and complex geometry can be handled with ease. In addition, the user specifies the number of bits n and their individual desired voltages or the attenuation value between contacts, along with their contact geometries. "Ladder Designer" solves the Laplace equation numerically using a finite element methodology and generates n contour lines in the region where the solved potentials are equal to the desired n contact potentials. Technically placing the contacts anywhere on the contour lines is sufficient to get the desired voltages at those locations. But this might require some user input due to the other layout constraints that the designer might have related to the peripheral portion of the design. Thus the user defines the location of the contacts wherever on the related contour lines, and the "Ladder Designer" re-simulates the region with the contact locations graphically entered by the designer. Re-simulation is necessary due to the additional boundary conditions introduced by the ladder contacts. At ladder contacts for reference voltage generation purposes, there will be no current pulled from the contacts, but having metallization on the finite contact regions will introduce additional boundary conditions to the Laplace equation. Since all metallization in the simulator assumes perfect conductors at the contacts, as in the reference and ground contacts, ladder contact regions have to be at constant potentials. Therefore the boundary condition at these locations are "floating contact" boundary conditions and the solution will be different compared to the initial solution of the Laplace equation. Since "Ladder Designer" knows the desired voltage values and their geometry, it will perturb their user-defined locations until the desired floating voltages at the contacts are satisfied.

Key Points of the Ladder Structure

Based on experience gained from a large number of numerical simulations, the most important guidelines in designing the proposed ladder structure is to keep the contact sizes smaller than t. In other words once the contact sizes are defined the proper t and attenuator length along with ladder contact locations can be calculated. As long as this is applied, all the analytical conclusions are valid and verified by numerical simulations as follows:

1. In the voltage attenuator the attenuation between contacts depends exponentially on the separation between the division/attenuation contacts.

2. In the current attenuator the current attenuation depends exponentially on the length of the partitioned ground contacts.

3. The resistivity of the ground contact has to be much less than the resistivity $\rho$ of the attenuator resistive layer.

Therefore consistency of one critical parameter, $\Delta x$, will maintain the accuracy of the entire ladder/attenuator structure. Since this is maintained by the self aligned contacts, manufacturability and yield of the ladder/attenuator should be exceptional.

Processing for Integrated Circuit Applications

In a typical Digital to Analog converter integrated circuit application, special metal layers with very desirable temperature coefficients might be employed. As an example a typical choice of metallization is silicon-chromium layers with 2 k$\Omega$/square sheet resistivities. The R resistors in the ladders are typically done with an aspect ratio of 5:1, giving 10 k$\Omega$ resistance to them. They have 150 ppm/C.° absolute temperature coefficient and temperature tracking, better than 1 ppm/C.° is obtainable. These might require additional expensive processing steps. If they already exist they can be used for the attenuator resistive region. SiCr, NiCr or any other low temperature coefficient alloy metals have very large resistivities compared to the ground contact resistivities, such as Al and Cu; therefore they all satisfy the criterion 3. If not, polysilicon layers with many flavors are readily available in any standard MOS or bipolar integrated circuit design for formation of resistance and gate regions. Some of them are doped, un-doped and silicided poly-silicon layers which all are suitable for the selection of the resistive layer in the linear attenuator structure. In any kind of integrated circuit technology, the poly-silicon layers even if salicided, has resistivities much larger than the any metallization layers used, which satisfies the criterion 3 for the ground contact resistivity condition easily.

Figure 10A:
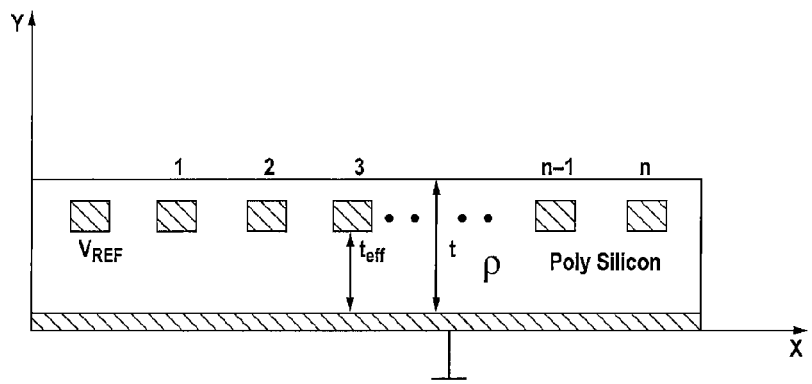
FIG. 10A is a top view of a two-dimensional device constructed in poly-silicon.
Figure 10B:
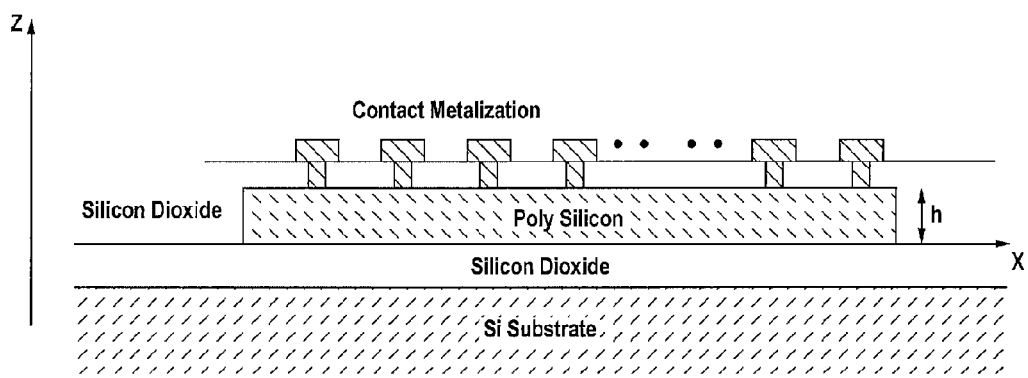
FIG. 10B is a side cross sectional view of a device according to the invention indicating specific material layers as shown with respect to the z axis (depth).

The only problem: it is difficult to metallize the poly-silicon layers from top and bottom to realize the original structure as shown in FIG. 1A. Moreover, the thickness of the poly-silicon layer is very thin and it can vary. Since thickness t is an important attenuation parameter, its variation is not desirable. Flipping the z axes with x or y axes solves all the issues associated with it. The resulting structure becomes planar, much easier to implement in any semiconductor or multi-layered ceramic process and the ground and reference contact separation t, becomes lithography controlled a poly-silicon layer is also suitable for the attenuator. Since the attenuator occupies a small area, the temperature gradient in the attenuator region is negligible, and the resistivity and thickness variations are minimal. Compactness of the attenuator makes possible its use in standard low-cost integrated circuit processes, not requiring additional expensive special metallization steps as in other types of DACs. For resistance uniformity, salicided poly-silicon, which is used for the gate regions of MOS process, is a better practice. As can be seen in FIG. 10A and FIG. 10B, the process is fully self-aligned and there is no processing or lithography related critical steps and flows with any standard process. Notably, there is no ground plane under the substrate. Rather the ground contact for reference purposes is a metallization on a side margin.

Figure 11A:
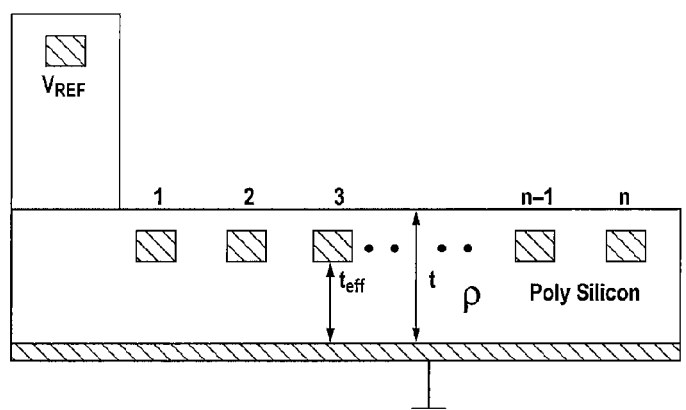
FIG. 11A is a top view of a three-dimensional device constructed in poly-silicon.
Figure 11B:
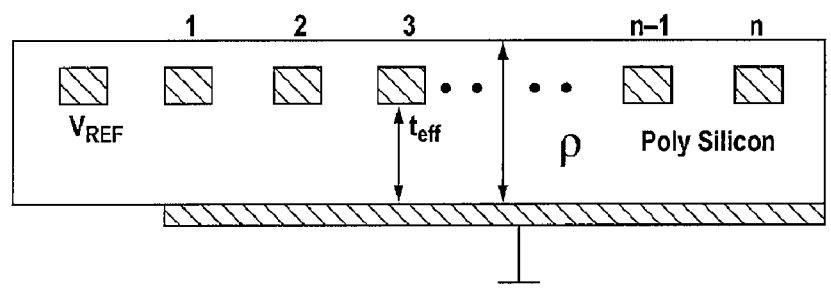
FIG. 11B is a top view of a further three-dimensional device constructed in poly-silicon.
Figure 11C:
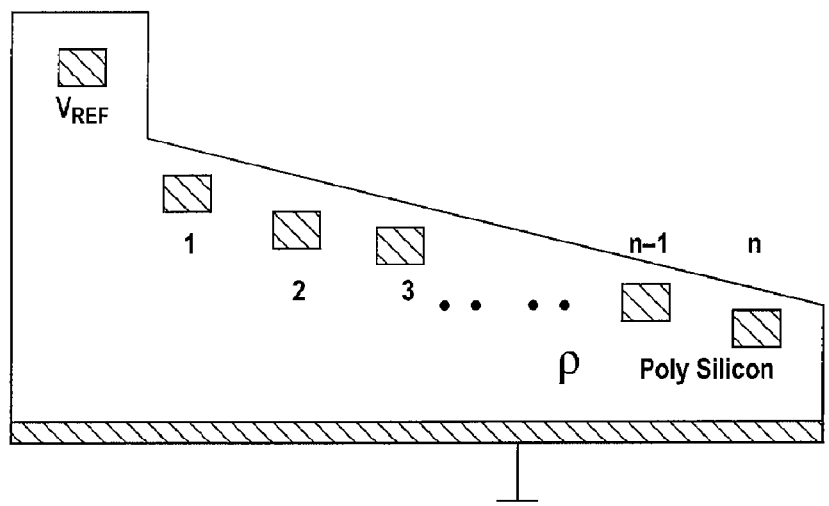
FIG. 11C is a top view of a still further three-dimensional device constructed in poly-silicon.
Figure 12:
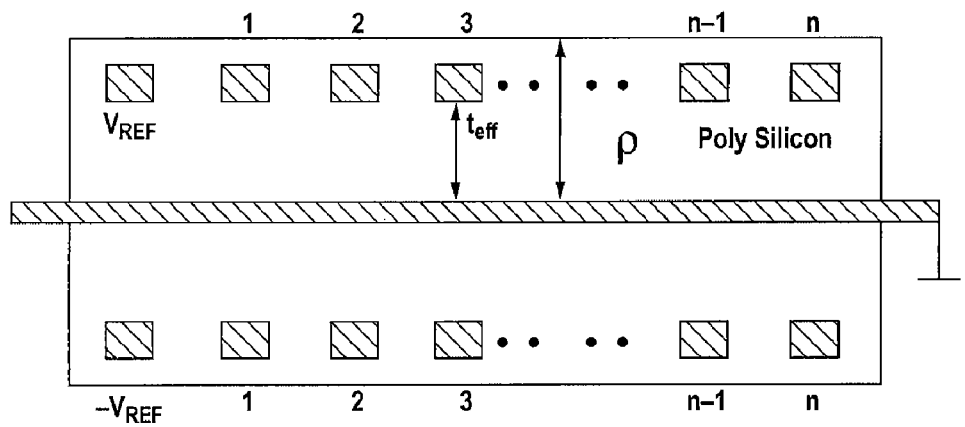
FIG. 12 is a top view of a still further three-dimensional device constructed in poly-silicon.

FIGS. 11A, 11B, and 11C represent several variations of the planar structure using again poly-silicon resistances. FIG. 11A shows how to adjust the input impedance of the ladder and achieves more relaxed spacing between ladder nodes and the reference contact. Since numerical simulations give the ladder node coordinates, any structure basically can be simulated and therefore designed as an attenuator. FIG. 11B shows the structure where the ground contact does not cover the entire bottom portion of the ladder but rather is along a side margin. Having a tapered structure as in FIG. 11C reduces the total capacitance of the ladder almost by half, which is desirable for high speed applications. FIG. 12 shows the differential application of the structure wherein the ground contact is a metallization in the middle of the substrate between the divider contacts 1-$n$.

All of the structures explained above can be applied to multi-layer ceramic thin or thick film ceramic processes without any modifications. The resistive layer, which will be used in the ceramic processes, is the layer being used for making thick or thin film resistances instead of poly-silicon in integrated circuits.

Radial Attenuator Structure

In the structures explained above the current flow is two-dimensional. Attenuation based on three dimensional current flow is also possible using the structure shown in FIG. 13A and FIG. 13B. This structure is also easily achievable in any semiconductor or multi-layer ceramic process with metallizations and resistive layers.

To understand the radial attenuator operation similar analytical derivation of the attenuation process in radial direction must be explained.

Figure 13A:
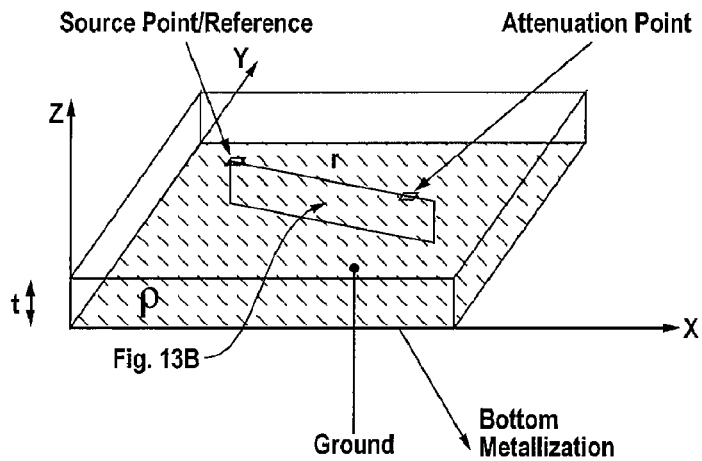
FIG. 13A is a perspective view of a slice shown in FIG. 13B.
Figure 13B:
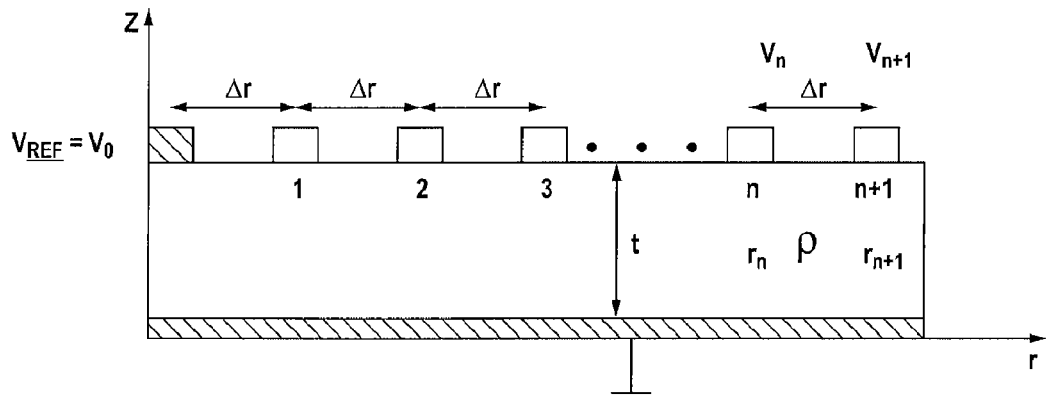
FIG. 13B is a side cross section of a slice from the device of FIG. 13A.
Figure 14:
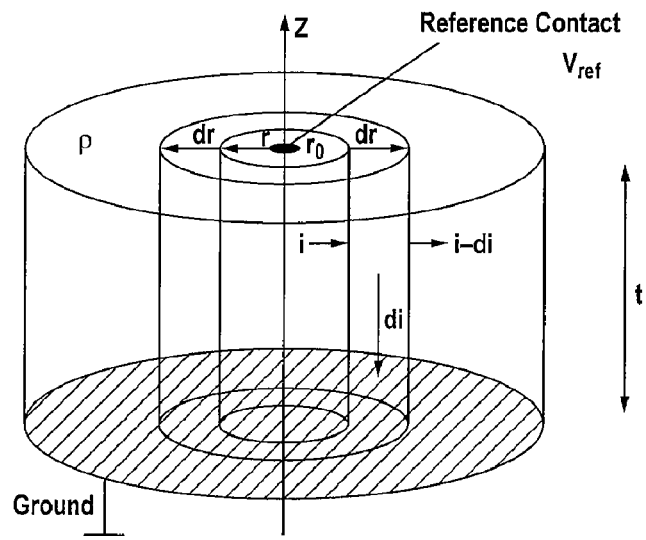
FIG. 14 is a perspective view of a cylindrical device for derivation of an analytical model in cylindrical coordinates.

Analytical Derivation of the Voltage Attenuation Process in Radial Attenuator Structure In this section the analytical derivation in cylindrical coordinates is given. The goal is to find the voltage attenuation along the radial direction when a reference voltage $V_{ref}$ is applied to the contact with a radius of $r_0$ as shown in FIG. 13A analytically. The thickness and the resistivity of the conductive layer on the ground plane are t and $\rho$ respectively as in the earlier analysis. Without doing any analysis, due to the radial nature of the structure, one would expect that the voltage attenuation as a function of r should be larger than the linear attenuator structure. In the analysis, the same assumptions are made as in the earlier case, that there is no voltage variation along z axes or it is very small compared to the voltage variation along r. If the thickness t is kept small compared to the radius of the structure, this can be a valid approximation. In addition to that also the structure is perfectly symmetric along z axes as in FIG. 14.

When the current it in the radial direction is flowing through the ring between r and r+dr, the voltage drop dV in the ring can be represented as, $$dV_r = i_r dR \tag{35}$$

dR being the resistance of the ring in radial direction in (35). The ring radial resistance can be written as, $$dR = \rho \cdot \frac{dr}{2\pi rt} \tag{36}$$

Substituting (35) in (36), $$dV_r = i_r \rho \frac{dr}{2\pi rt} \tag{37}$$

By dividing both sides with dr, we give the first differential equation as $$\frac{dV_r}{dr} = i_r \frac{\rho}{2\pi rt} \tag{38}$$

By solving $i_r$ from (38), which will be used later gives $$i_r = \frac{2\pi rt}{\rho} \cdot \frac{dV}{dr} \tag{39}$$

Now formulate the z directional current flowing in the ring defined between r and r+dr from the surface of the ring to the ground plane in the bottom. If $V_r$ is the voltage at radius r the current flowing along the z direction in the ring can be represented as, $$di_r = \frac{V_r}{\rho \frac{t}{\pi[(r+dr)^2 - r^2]}} \tag{40}$$

Rearranging (40) gives $$di_r = \frac{V_r}{\rho \cdot t} \pi[(r+dr)^2 - r^2] \tag{41}$$

Evaluating the squared bracket at (41) will give $$di_r = \frac{V_r}{\rho \cdot t} \pi \{[r^2 + 2r \cdot dr + (dr)^2] - r^2\} \tag{42}$$

When dr→0, $(dr)^2$=0, Therefore (42) can be re-written as, $$di_r = \frac{V_r}{\rho \cdot t} 2\pi r dr \tag{43}$$

Resulting in the second differential equation as $$\frac{di_r}{dr} = V_r \frac{2\pi r}{\rho \cdot t} \tag{44}$$

To get Vr as the only variable in the formulation, differentiate (44) with respect to r to get $$\frac{d^2 V_r}{dr^2} = \frac{\rho}{2\pi t} \left[ \frac{1}{r} \frac{di_r}{dr} - i_r \frac{1}{r^2} \right] \tag{45}$$

The term $i_r$ and its derivative with respect to r is given by (39) and (44), which are all functions of $V_r$ and r. Therefore substituting them in (45) will result in completely representing the formulation in terms of $V_r$ and gives $$\frac{d^2 V_r}{dr^2} = \frac{\rho}{2\pi t} \left[ \frac{1}{r} \cdot \frac{2\pi r}{\rho \cdot t} V_r - \frac{1}{r^2} \frac{2\pi rt}{\rho} \frac{dV_r}{dr} \right] \tag{46}$$

By doing the simplifications in (46) will give the final analytical formulation as $$\frac{d^2 V_r}{dr^2} = \frac{1}{t^2} V_r - \frac{1}{r} \frac{dV_r}{dr} \tag{47}$$

Rearranging the terms will result in the differential equation which formulates the attenuation process in radial direction.

$$\frac{d^2 V_r}{dr^2} + \frac{1}{r} \frac{dV_r}{dr} - \frac{1}{t^2} V_r = 0 \tag{48}$$

To bring (48) to a well-known form, both sides are multiplied with $r^2$ giving (49) as $$r^2 \frac{d^2 V_r}{dr^2} + r \frac{dV_r}{dr} - \frac{r^2}{t^2} V_r = 0 \qquad (49)$$

To make it look similar to standard form of differential equations, (49) can be written as $$r^2 \frac{d^2 V_r}{dr^2} + r \frac{dV_r}{dr} - r^2 \lambda^2 V_r = 0 \qquad (50)$$

This is a Bessel type of differential equation. The Bessel Differential Equation in its very general form can be written as $$x^2 \frac{d^2 y}{dx^2} + x \frac{dy}{dx} + (\lambda^2 x^2 - n^2) y = 0 \qquad (51)$$

As can be seen for n=0, the sign of the last term in (50) does not match (51). On the other hand the Modified Bessel Differential Equation in its very general form is given as $$x^2 \frac{d^2 y}{dx^2} + x \frac{dy}{dx} - (\lambda^2 x^2 + n^2) y = 0 \qquad (52)$$

and (50) perfectly fits this type. Therefore the radial voltage attenuation equation (49) falls into the category of a Modified Bessel Differential equation with an order of zero as below, $$x^2 \frac{d^2 y}{dx^2} + x \frac{dy}{dx} - \lambda^2 x^2 y = 0, \text{ where } \lambda = \frac{1}{t} \qquad (53)$$

The solution of the Modified Bessel Differential Equation given at (52) is $$y(x) = C_1 I_n(\lambda x) + C_2 K_n(\lambda x) \qquad (54)$$

Since the boundary conditions are $V_r(r_0) = V_{ref}$ and $V_r(\infty) = 0$, the only suitable function is the $K_0$, of the Modified Bessel Functions at (54), giving $C_1 = 0$. Adopting (54) and using the boundary conditions will result in the analytical solution given by $$V_r(r) = \frac{V_{ref}}{K_0\left(\frac{r_o}{t}\right)} K_0\left(\frac{r}{t}\right) \qquad (55)$$

Figure 15:
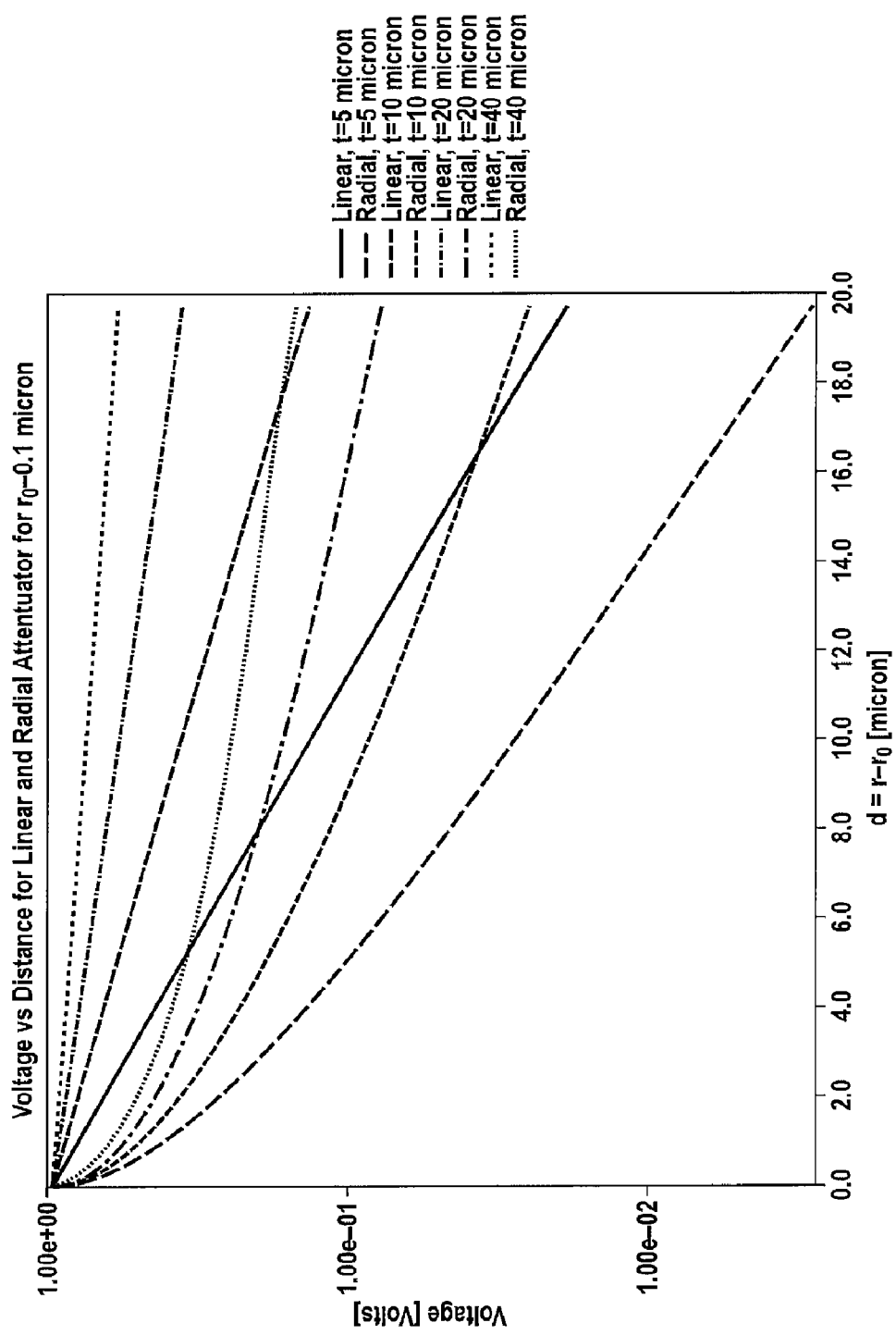
FIG. 15 is a graph for illustrating differences between radial and linear attenuation for a first type.
Figure 16:
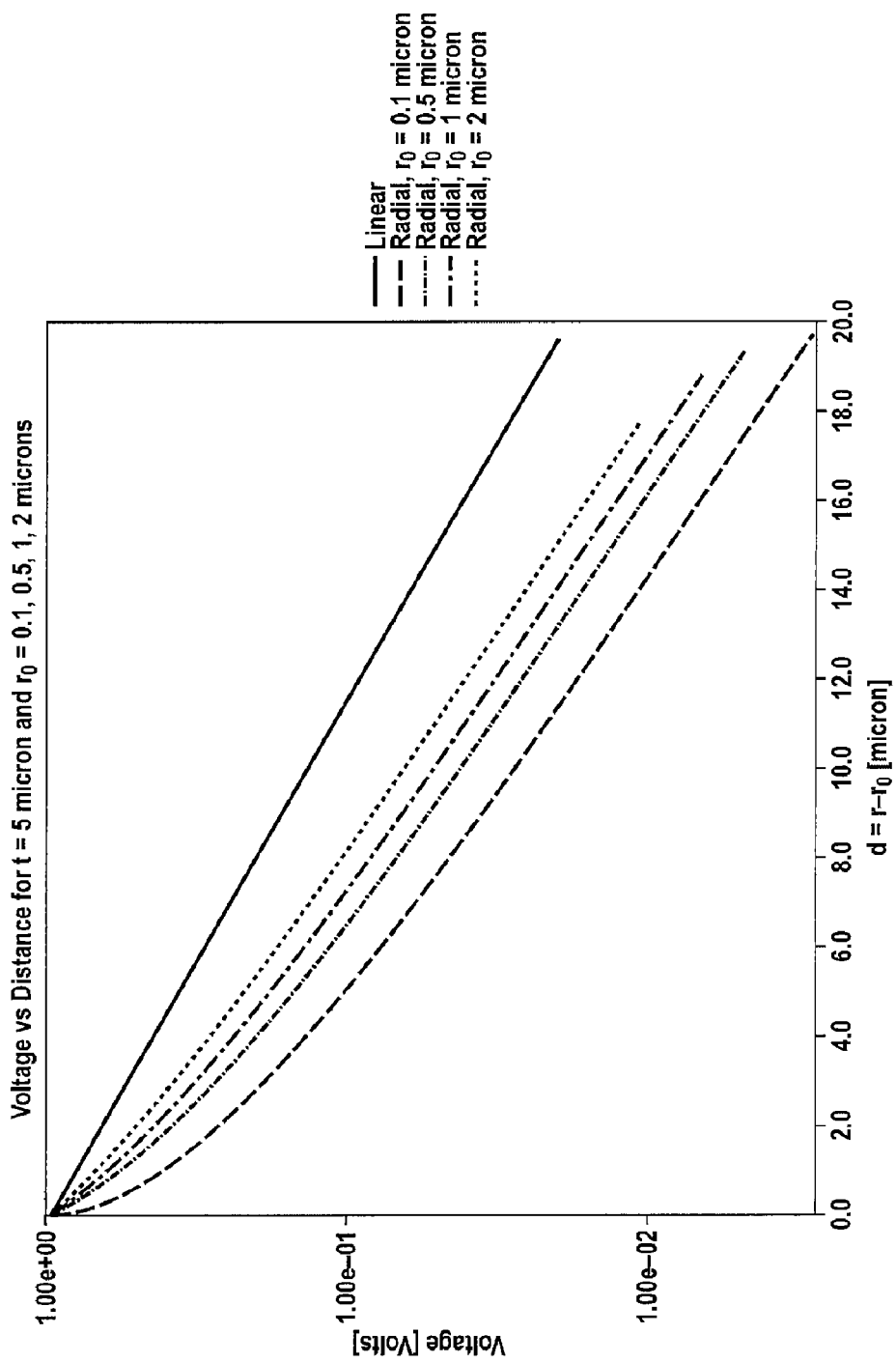
FIG. 16 is a graph for illustrating voltage attenuation for radial attenuation for a second type.

The solution given at (55) has two attenuation parameters, $r_0$ and t besides r. FIG. 15 shows the attenuation characteristics for various t's, 5, 10, 20 and 40 for $r_0$=0.1, all in microns, in all curves. FIG. 15 also has the linear-type attenuator attenuation functions given at (17) to show both of the attenuations comparatively. As can be seen, the radial attenuator has a steeper attenuation as a function of r compared to the ladder type attenuator with same thickness t, as expected. FIG. 16 displays the effect of the reference contact radius $r_0$ on the attenuation characteristics for the radial attenuator for t=5 microns and for $r_0$=0.1, 0.5, 1 and 2 microns. It also shows the linear attenuator attenuation as a function of distance away from the reference contact to give a good comparison. As can be seen for smaller $r_0$'s, the initial attenuation is a much steeper function compared to the larger reference contact radiuses. As a result, for a larger attenuation at a given distance $d=r-r_0$ away from the reference contact, a contact with a smaller radius as the reference contact is desirable.

Figure 17:
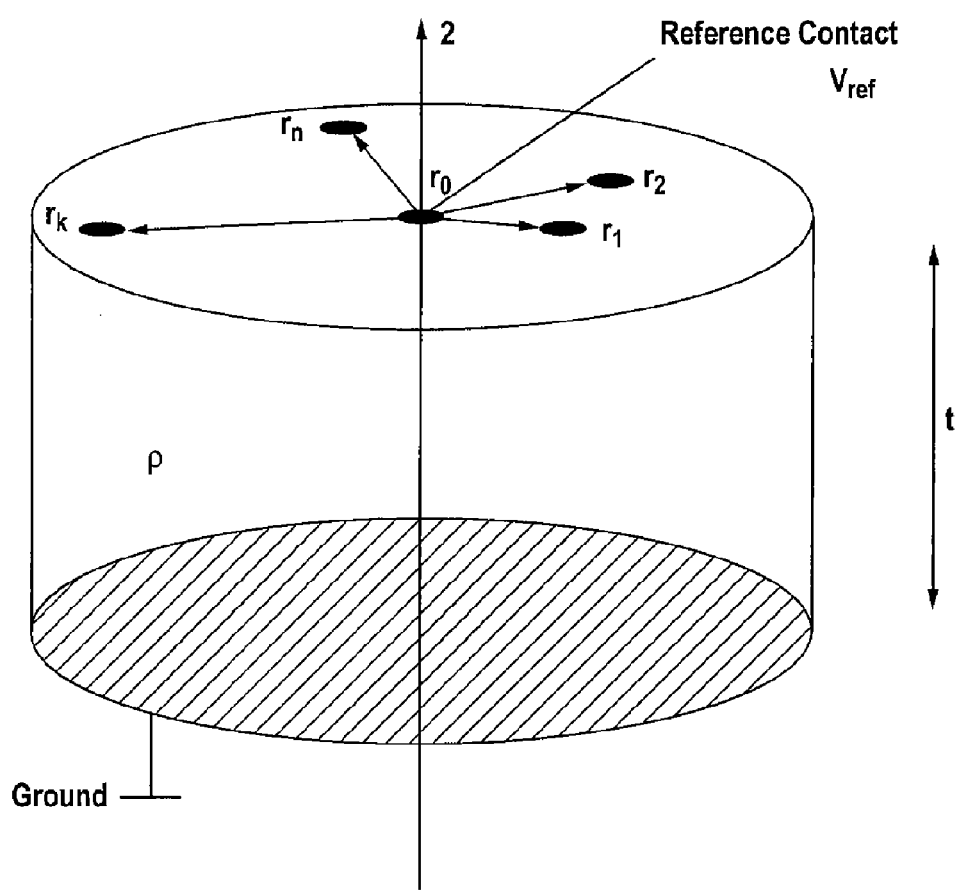
FIG. 17 is a perspective view of a cylindrical device according to the invention.

To design the radial attenuator it is necessary to find the radial placement of the attenuation/division contacts for a given reference contact radius $r_0$ and resistive layer thickness t. This could be done by solving r at (55), for desired attenuation voltages $V_n$'s for the given $r_0$ and t and is illustrated in FIG. 17. The solution is possible only numerically.

As in the ladder type attenuator the analytical solution as given at (55) is only a good approximation and is not good enough for any combinations of $r_0$ and t's. To accurately predict the radial coordinates of the division/attenuation contacts, a three-dimensional solution of Laplace's equation in cylindrical coordinates is required. The program "Ladder Designer" has this capability and is used for accurate placements of the division/attenuation contacts for desired attenuations.

Silicon Substrate as the Resistive Layer of the Radial Attenuator

The radial attenuator can be realized by using the semiconductor substrate it self as the resistive layer. The key point is to metallize the bottom of the wafer and tie it to the ground, so it is not at a floating potential. The grounded bottom contact must be an ohmic contact.

If the bottom contact is left floating instead of grounded, for distances larger than 2t away from the reference contact, there will be almost no attenuation. The voltage distribution at the surface will almost be independent from the radial distance from the reference contact. Obviously this configuration cannot be used as an attenuator.

Figure 18:
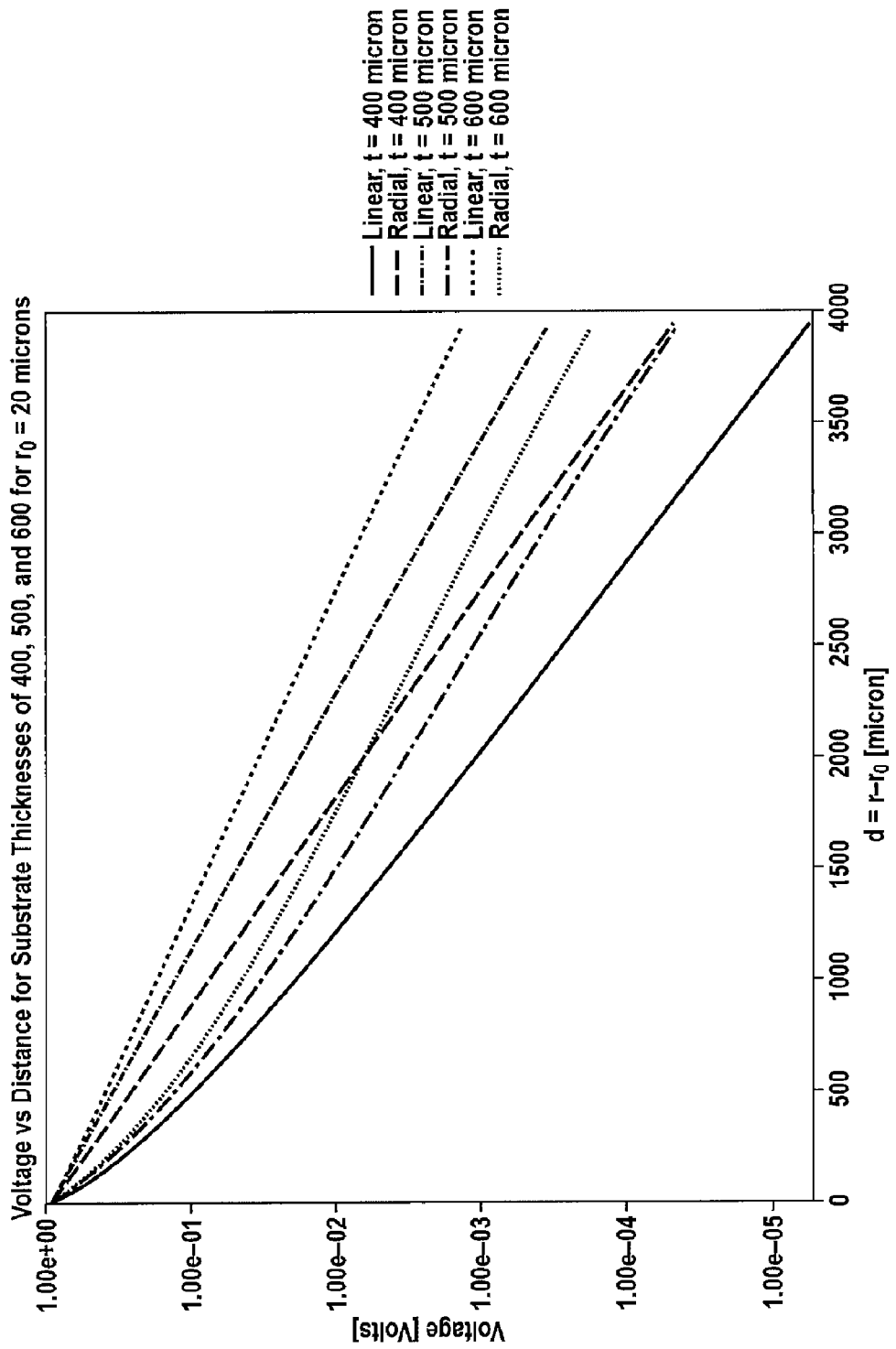
FIG. 18 is a graph for illustrating voltage attenuation for radial attenuation for a third type.

Since wafer thickness t is in the order of 300 to 600 microns, the significant attenuation will begin at distances larger than the substrate thickness away from the reference contact. This is illustrated in FIG. 18. FIG. 18 shows attenuation as function of distance for various substrate thickness, t=400, 500 and 600 microns and for $r_0$=20 micron reference contact radius compared to the linear attenuator having same substrate thicknesses. Since t, along with the attenuation value desired determines the size of the attenuator this type of attenuator is not very size efficient.

Substrate semiconductor material is usually lightly doped compared to the doping levels of the active regions, giving larger resistivity variation with temperature. This and its large area requirement for a given attenuation makes it not suitable for good temperature tracking for on chip ladder applications. But the structure can be very effectively used if there is a need for large attenuation in a small area with large current carrying requirements, rather than the precision of attenuation.

The invention has been explained with reference to specific embodiments. Other embodiments will be evident to those of ordinary skill in the art in light of this specification. Therefore it is not intended that this invention be limited except as indicated by the appended claims.

What is claimed is:

1. An attenuator structure in a bulk electrical semi-conductive material comprising:
   a substrate formed of a planar distributed resistive material of uniform resistivity disposed along ground;
   a reference electrical contact at a reference point on a first side of said substrate;
   a distributed ground contact region along a second side of said substrate opposite said first side, said ground contact region being subdivided into a plurality of adjacent electrically conductive segments separated by small gaps along an axis of equipotential voltage, said segments defining a plurality of attenuation values in a longitudinal pattern based on distance from said reference electrical contact and without patterning of the distributed resistive material of the substrate; and thus forming a distributed resistive structure having the mathematical property that it attenuates an applied reference current logarithmically/exponentially based on size and average distance of said conductive segments from said reference contact of said structure.

2. The attenuator structure according to claim 1 wherein said semi-conductive material is a conventional integrated circuit resist.

3. The attenuator structure according to claim 1 wherein said semi-conductive material is a hybrid circuit resist.

4. The attenuator structure according to claim 1 wherein said semi-conductive material is a conventional thin film resist.

5. The attenuator structure according to claim 1 wherein said semi-conductive material is a conventional thick film resist.

6. The ladder attenuator structure according to claim 1 wherein the reference contact is at a margin.

7. The attenuator structure according to claim 1 wherein the reference electrical contact is disposed at a margin and having attenuation/division electrical contacts, the attenuation/division electrical contacts being disposed along a line.

8. The attenuator structure according to claim 1 wherein the reference electrical contact is at a point within said substrate and the attenuation/division electrical contacts are disposed at selected radii from the point of the reference electrical contact in a radial structure having a relatively higher attenuation slope as compared to a linear attenuator structure.

9. The attenuator structure of claim 1 wherein said first side is at a first lateral position of said substrate and said second side is at a second lateral position of said substrate.

10. The attenuator structure of claim 1 wherein said ground contact region is on the bottom side of said substrate and said reference electrical contact is on the top side of said substrate.

* * * * *